United States Patent
Zhu et al.

(10) Patent No.: US 12,114,435 B2
(45) Date of Patent: Oct. 8, 2024

(54) SURFACE MOUNT TECHNOLOGY METHOD AND MAGNETIC CARRIER SYSTEM

(71) Applicant: Sandisk Technologies, Inc., Milpitas, CA (US)

(72) Inventors: Virgil Zhu, Shanghai (CN); Vincent Jiang, Shanghai (CN); Paul Qu, Shanghai (CN); Shixing Zhu, Shanghai (CN); Yuanheng Zhang, Shanghai (CN); Enoch He, Shanghai (CN); Yonglong Liu, Shanghai (CN); Lian Chen, Shanghai (CN); Guangqiang Li, Shanghai (CN); Jingyun Chen, Shanghai (CN)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 249 days.

(21) Appl. No.: 17/744,291

(22) Filed: May 13, 2022

(65) Prior Publication Data
US 2023/0371185 A1 Nov. 16, 2023

(51) Int. Cl.
*B23K 1/00* (2006.01)
*B23K 3/00* (2006.01)
(Continued)

(52) U.S. Cl.
CPC ......... *H05K 3/3494* (2013.01); *B23K 1/0016* (2013.01); *B23K 37/04* (2013.01);
(Continued)

(58) Field of Classification Search
CPC .............................. B23K 1/0016; B23K 3/087
See application file for complete search history.

(56) References Cited

U.S. PATENT DOCUMENTS 5,276,762 A * 1/1994 Hartman .............. G02B 6/4249
385/65
5,447,886 A * 9/1995 Rai ........................ H01L 24/81
438/125
(Continued)

FOREIGN PATENT DOCUMENTS

CN 203563269 U 4/2014
CN 210202353 U 3/2020
(Continued)

*Primary Examiner* — Erin B Saad
(74) *Attorney, Agent, or Firm* — Morgan, Lewis & Bockius LLP (57) ABSTRACT

A method of soldering one or more components to a substrate includes providing a substrate and applying an amount of solder material to the top planar surface of the substrate. One or more electrical components are mounted to the solder material in a predetermined position and orientation. A carrier is provided having one or more magnets embedded therein. The substrate is positioned above the carrier such that each of the one or more magnets is positioned directly below a corresponding electrical component. A carrier cover is positioned above the substrate and the electrical components. The solder material is heated to a predetermined temperature for a predetermined amount of time during which each of the magnets exerts a magnetic force on a corresponding electrical component to maintain its orientation relative to the substrate. The magnets reduce the occurrence of tombstoning of the electrical components during heating of the solder material.

16 Claims, 7 Drawing Sheets

(51) Int. Cl.
  *B23K 37/04*     (2006.01)
  *H05K 3/34*      (2006.01)
  *B23K 101/42*    (2006.01)

(52) U.S. Cl.
  CPC ........... *H05K 3/341* (2013.01); *H05K 3/3457* (2013.01); *B23K 2101/42* (2018.08)

(56) References Cited

U.S. PATENT DOCUMENTS

| | | | | |
|---|---|---|---|---|
| 5,479,694 A | * | 1/1996 | Baldwin | G01R 1/04 |
| | | | | 324/763.01 |
| 5,816,482 A | * | 10/1998 | Grabbe | H01L 21/6835 |
| | | | | 219/616 |
| 6,188,052 B1 | * | 2/2001 | Trucco | B23K 1/002 |
| | | | | 219/616 |
| 6,429,384 B1 | * | 8/2002 | Downes, Jr. | H01L 24/81 |
| | | | | 174/250 |
| 10,048,450 B2 | * | 8/2018 | Dubey | G02B 6/4244 |
| 10,409,014 B1 | * | 9/2019 | Ramachandran | G02B 6/4243 |
| 2004/0110366 A1 | * | 6/2004 | MacKay | H01L 24/13 |
| | | | | 228/248.1 |

FOREIGN PATENT DOCUMENTS

| | | |
|---|---|---|
| CN | 211182169 U | 8/2020 |
| JP | H09232695 A | 9/1997 |
| KR | 101422063 B1 | 8/2014 |

\* cited by examiner

SURFACE MOUNT TECHNOLOGY METHOD AND MAGNETIC CARRIER SYSTEM

BACKGROUND

The present disclosure generally relates to Surface Mount Technology methods and, more particularly, to a surface mount technology method including the use of a magnetic carrier system.

Surface Mount Technology (SMT) is a method commonly used to mount electrical components directly onto the surface of a substrate, such as a printed circuit board (PCB). In SMT methods, various areas on the surface of the PCB are covered with a solder paste material. The electrical components are mounted on said areas covered with the solder paste material. The PCB undergoes a reflow process wherein the PCB, the solder paste, and the electrical components mounted thereto is placed into a reflow oven and subjected to controlled heat. During reflow, the solder paste is melted causing it to create permanent solder joints between the electrical components and the PCB. However, during reflow the electrical components may shift or rotate such that they are not in the intended position relative to the PCB. For example, the electrical components may experience component shift, in which the electrical components shift in a direction transverse to the PCB surface, and/or the electrical components may experience tombstoning in which the component rotates upwards such that one end is no longer in contact with the solder paste. Component shift and tombstoning each often lead to defects in the electrical and mechanical connection between the PCB and the respective electrical component, which results in a faulty product. Therefore, there is a need to improve the SMT method to prevent, or at least reduce the occurrence of, component shift and tombstoning during reflow.

SUMMARY

In one embodiment there is a method of soldering one or more components to a substrate, the method includes providing a substrate having a top planar surface and a bottom planar surface and applying an amount of solder material to at least a portion of the top planar surface of the substrate. The method further includes mounting one or more electrical components on the solder material, each of the one or more electrical components having a position and orientation relative to the substrate, and providing a carrier having a top carrier surface and a bottom carrier surface, and one or more magnets disposed between the top and bottom carrier surfaces. The method further includes positioning the substrate above the carrier such that the bottom planar surface of the substrate is above the top carrier surface and each of the one or more magnets is positioned directly below a corresponding electrical component of the one or more electrical components. The method further includes positioning a carrier cover above the top planar surface of the substrate such that there is a gap between the carrier cover and the one or more electrical components, and heating the solder material to a predetermined temperature for a predetermined amount of time to cause the solder material to melt. The method further includes during heating of the solder material, exerting, by each of the one or more magnets, a magnetic force on a corresponding electrical component of the one or more electrical components to maintain the orientation of the corresponding electrical component relative to the substrate while the solder material melts.

In some embodiments, the magnets are configured to prevent tombstoning of the one or more electrical components during the heating step. In some embodiments, the one or more magnets includes a first magnet and a second magnet positioned adjacent to the first magnet, wherein the one or more electrical components includes a first electrical component corresponding to the first magnet and a second electrical component corresponding to the second magnet, and the magnetic force exerted by the first magnet does not affect the position or orientation of the second electrical component corresponding to the second magnet. In some embodiments, the gap between the carrier cover and the one or more electrical components is about 10 micrometers.

In some embodiments, each of the one or more magnets disposed within the carrier have a maximum operating temperature that is greater than the predetermined temperature that the solder material is heated to during the heating step. In some embodiments, each of the one or more magnets disposed within the carrier have a maximum operating temperature of at least 350 degrees Celsius. In some embodiments, each of the one or more magnets disposed within the carrier have a magnetic force between about $336*10^{-6}$N to about $865*10^{-6}$N. In some embodiments, the heating step includes positioning the substrate having the one or more electrical components mounted thereto via the solder material, the carrier and the carrier cover in a reflow oven and operating the reflow oven to cause the solder material to melt.

In another embodiment there is a method for soldering one or more electrical components to a substrate comprising an amount of solder material coupling the one or more electrical components to the substrate. The method includes positioning a carrier below the substrate, the carrier including one or more magnets embedded therein, each of the one or more magnets positioned directly below a corresponding electrical component of the one or more electrical components. The method includes positioning a carrier cover above the substrate and spaced from the substrate such that there is a gap between the carrier cover and the one or more electrical components, and heating the solder material to a predetermined temperature for a predetermined amount of time to cause the solder material to melt. During heating of the solder material each of the one or more magnets exerts a magnetic force on a corresponding electrical component of the one or more electrical components to maintain the orientation of the corresponding electrical component relative to the substrate while the solder material flows about the corresponding electrical component.

In some embodiments, the magnets are configured to prevent tombstoning of the one or more electrical components during the heating step. In some embodiments, the magnets are configured to prevent the one or more electrical components from shifting in a direction that is transverse to the top planar surface of the substrate during the heating step. In some embodiments, the gap between the carrier cover and the one or more electrical components is about 10 micrometers. In some embodiments, each of the one or more magnets embedded within the carrier have a maximum operating temperature that is greater than the predetermined temperature that the solder material is heated to during the heating step. In some embodiments, each of the one or more magnets embedded within the carrier have a maximum operating temperature of at least 350 degrees Celsius. In some embodiments, each of the one or more magnets embedded within the carrier have a magnetic force between about $336*10^{-6}$N to about $865*10^{-6}$N. In some embodiments, the heating step includes positioning the substrate having the one or more electrical components mounted thereto via the solder material, the carrier and the carrier cover in a reflow oven and operating the reflow oven to cause the solder material to melt.

In another embodiment, there is a substrate assembly for assembling an electronic device, and the substrate assembly includes a substrate including a plurality of layers alternating between conductive layers and non-conductive layers, wherein the conductive layers comprise signal traces, the substrate having a top planar surface and an opposing bottom planar surface, a plurality of electrical components each mounted to the substrate via an amount of solder material, and a carrier having a top carrier surface and a bottom carrier surface, the carrier including a plurality of magnets embedded between the top and bottom carrier surfaces. Each magnet of the plurality of magnets exerts a magnetic force on a corresponding electrical component of the plurality of electrical components to maintain an orientation of the corresponding electrical component relative to the substrate.

In some embodiments, the plurality of magnets are configured to prevent tombstoning of the plurality of electrical components. In some embodiments, the plurality of magnets includes a first magnet and a second magnet positioned adjacent to the first magnet, wherein the plurality of electrical components includes a first electrical component corresponding to the first magnet and a second electrical component corresponding to the second magnet, and the magnetic force exerted by the first magnet does not affect the position or orientation of the second electrical component corresponding to the second magnet. In some embodiments, each magnet of the plurality of magnets embedded within the carrier have a magnetic force between about $336*10^{-6}$N to about $865*10^{-6}$N.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments, which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
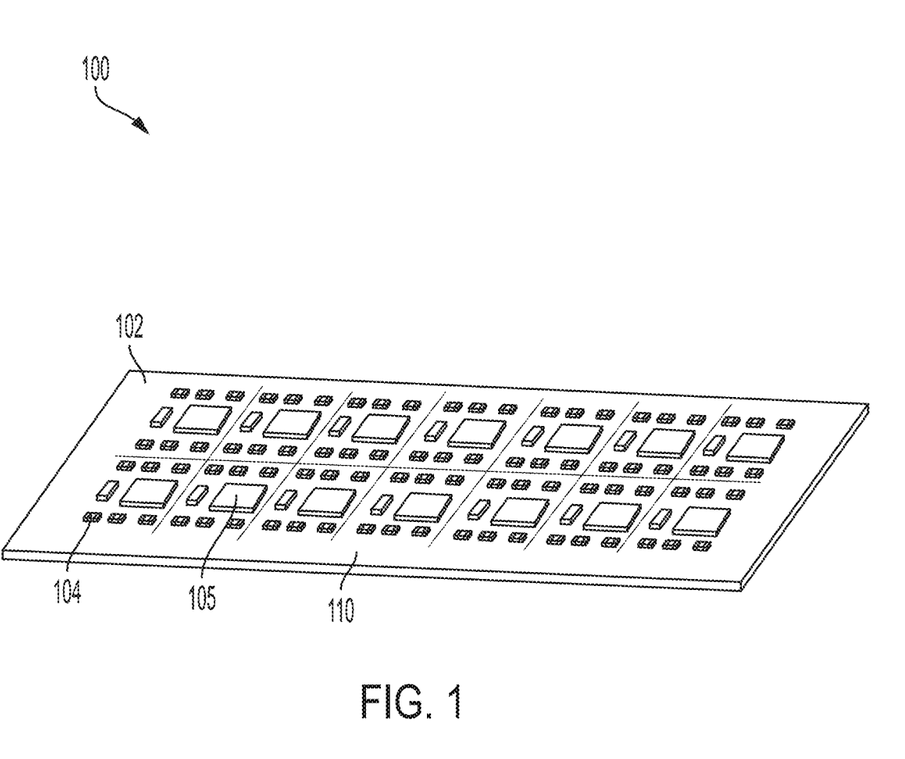
FIG. 1 is a perspective view of a substrate assembly in accordance with an exemplary embodiment of the present disclosure.

Referring to FIG. 1, there is shown a substrate assembly, generally designated 100, in accordance with an exemplary embodiment of the present disclosure. The substrate assembly 100 may include a substrate 102, one or more electrical components 104, and one or more other electrical components 105 coupled thereto. The substrate assembly 100 illustrated in FIG. 1 may represent an assembly of the substrate 102, the one or more electrical components 104, and the one or more other electrical components 105 prior to soldering the electrical components 104, 105 to the substrate 102. In some embodiments, the substrate 102 may be a mechanical base support for a semiconductor device package (not shown) and an electrical interface (or electrical circuit) that provides access to the electrical components 104, 105 coupled thereto. For example, the substrate 102 may include an electrical circuit 106 (shown in FIGS. 2A-2B) including plurality of metal layers and/or traces disposed within the substrate 102, including one or more layers for routing signals such as, but not limited to, input/output signals, power signals, and ground signals using conductive (e.g., copper) traces. In some embodiments, the plurality of layers of the substrate alternate between conductive and non-conductive layers. The conductive layers may include one or more signal traces. The electrical circuit 106 may be positioned between a top planar surface 110 and a bottom planar surface 111 (shown in FIG. 2A) of the substrate 102.

The one or more electrical components 104 may be components that are, according to conventional soldering methods, prone to certain assembly related defects, and the one or more other electrical components 105 may be components that are not prone to or have a significantly low chance of experiencing certain assembly related defects. For example, a distinction between the electrical components 104 and the other electrical components 105 is that the other electrical components 105 are less prone to reflow tombstoning and/or shift defects than the electrical components 104 in a conventional SMT process. This may be dependent upon the relative size and/or weight of the components 104, 105 and/or the manner in which said components are coupled to the substrate 102. For example, the electrical components 104 may be SMT components that are mounted to the substrate 102 according to an SMT method prior to reflow. The electrical components 104 may have a size and/or weight that is significantly lesser than the size and/or weight of the other electrical components 105. For example, the electrical components 104 may be resistors and/or capacitors and the other electrical components 105 may be semiconductor dies.

In some embodiments, the electrical components 104 are components having a length and width that is less than or equal to an existing SMD package type, which is often abbreviated using an SMD package type size code. The SMD package type size codes referenced herein are in the imperial system. For example, the electrical components 104 may be components having a size that is equivalent to or less than SMD package type 0201, where the length is 0.6 mm and the width is 0.3 mm, and/or the SMD package type 01005, where the length is 0.4 mm and the width is 0.2 mm. However, it will be understood that other components having a size that is greater than the examples provided above may also be considered as electrical components 104. For example, the electrical components 104 may be any component that has a weight and/or size that would result in the forces from the surface tension caused by a solder material to be larger than the gravitational forces relating to said components size and/or weight.

In some embodiments, the electrical components 104 are SMT components and the other components 105 are not SMT components. The one or more electrical components 104 may include, resistors, capacitors, SMT diodes, transistors and the one or more other electrical components 105 may be any other electrical component. For example, the other electrical components 105 may include, but are not limited to, semiconductor dies (e.g., NAND memory dies, controller dies, application-specific integrated circuit (ASIC) dies, or other integrated circuit (IC) dies). In some embodiments, the one or more other electrical components 105 may include SMT components as well. The one or more other electrical components 105 will not be discussed in further detail, however, it should be understood that the one or more other electrical components 105 are any electrical component to which the method(s) of the present disclosure, as discussed in more detail below with reference to FIGS. 4-8, may not be directed to. Put another way, the method(s) of the present disclosure include positioning magnets below certain electrical components (e.g., electrical components 104) in order to prevent, or at least reduce, the occurrence of component shift and/or tombstoning during reflow of the substrate assembly 100. As such, the other electrical components 105 may be characterized as electrical components coupled to the substrate 102 that have no magnets positioned below them during reflow, according to the method(s) of the present disclosure.

In some embodiments, the electrical components 104 may be mounted to the substrate 102 at predetermined locations for soldering. For example, the electrical components 104 may be arranged on the substrate 102 at locations that correspond to the locations where electrical connections will be established. Said electrical connections may correspond to locations at the top surface 110 of the substrate 102 where portions of the electrical circuit 106 are exposed to allow for electrical connections between the electrical components 104 and substrate 102 to be formed. In some embodiments, a solder material (e.g., a solder paste) is used to mount the electrical components 104 to the substrate 102 at the desired locations and to form the electrical connection, following reflow soldering.

Figure 2A:
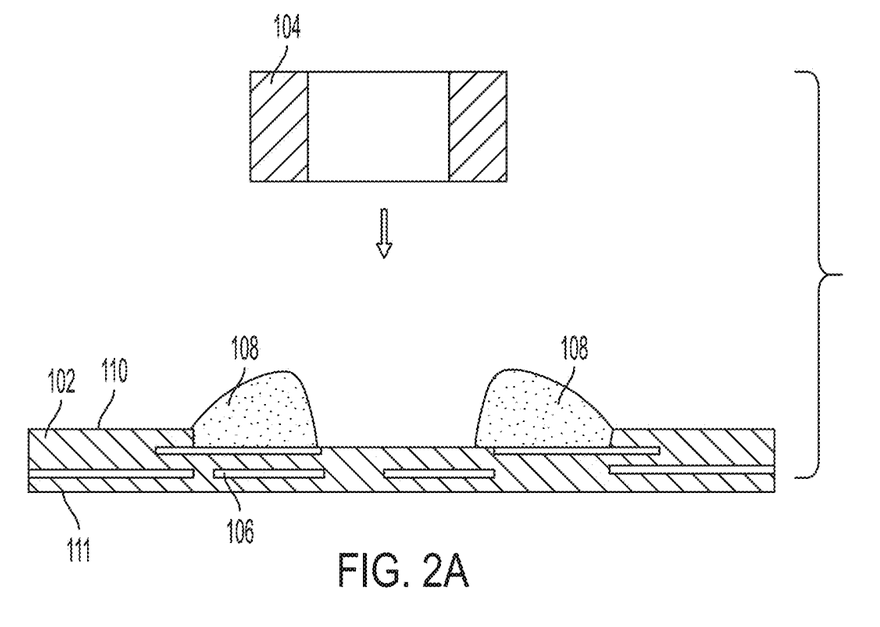
FIGS. 2A-2B are magnified side cross-sectional views illustrating mounting an electrical component to a substrate included in the substrate assembly of FIG. 1.
Figure 2B:
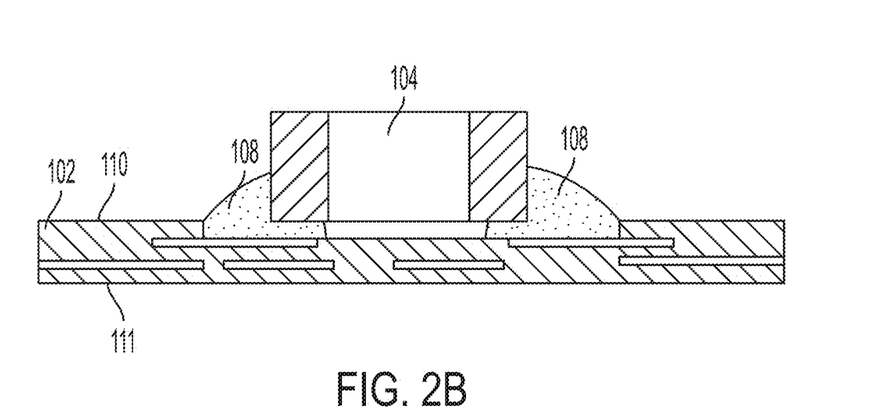

Referring to FIGS. 2A-2B, there is illustrated an electrical component 104 coupled to substrate 102 according to an SMT method prior to reflow. The dimensions of SMT components may be defined by one or more industry standards such as, but not limited to, the joint electron device engineering council (JEDEC) standards. There may be portions of solder material 108 applied to the top planar surface 110 of the substrate 102 (see FIG. 2A). The solder material 108 may be a solder paste including a combination of a powder made up of metal solder particles and a flux material. The flux material may be a sticky flux that has adhesive characteristics. The solder material 108, while a paste, may flow like a fluid when a sufficiently large load or stress is applied to it. The solder material may be any conventional solder material known to those skilled in the art. In some embodiments, the solder material 108 is in direct contact with at least a portion of the electrical circuit 106 of the substrate 102. For example, the solder material 108 may be in direct contact with the portions of the electrical circuit 106 exposed at the top planar surface 110 of the substrate 102.

In some embodiments, the electrical components 104 are mounted directly onto the solder material 108 thereby coupling the electrical components 104 to the substrate 102 (see FIG. 2B). In FIG. 2B, the solder material is a paste, as described above, that has not been heated to a temperature to cause the solder paste to melt and/or solidify (e.g., the eutectic temperature). Put another way, the solder material 108 illustrated in FIGS. 2A-2B has not been subjected to soldering (e.g., reflow soldering) yet. As such, the solder material 108, may act as an adhesive that is coupling the electrical components 104 to the substrate 102. For example, the flux included in the solder paste mixture, may act as a temporary adhesive that holds the electrical components 104 in place relative to the substrate 102. In this manner, the electrical components 104 are coupled to the substrate 102 and held in the intended positions relative to the substrate 102 prior to soldering. The electrical components 104 may be coupled to the substrate 102 via the solder material 108, however, it should be understood that the electrical components 104 are not fixedly coupled to the substrate 102. For example, while the solder material 108 may act as an adhesive keeping the electrical components 104 in place, there is no permanent solder joint formed that fixedly couples the electrical components 104 to the substrate 102.

Although a single electrical component 104 is illustrated in FIGS. 2A-2B, it will be understood that one or more of the electrical components 104 illustrated in FIG. 1, may be coupled to the top planar surface 110 of the substrate 102 in generally the same manner as what is depicted in FIGS. 2A-2B. In some embodiments, each of the electrical components 104 is mounted to the substrate 102, prior to soldering, in generally the same manner as what is illustrated and described above, with reference to FIGS. 2A-2B.

Figure 3:
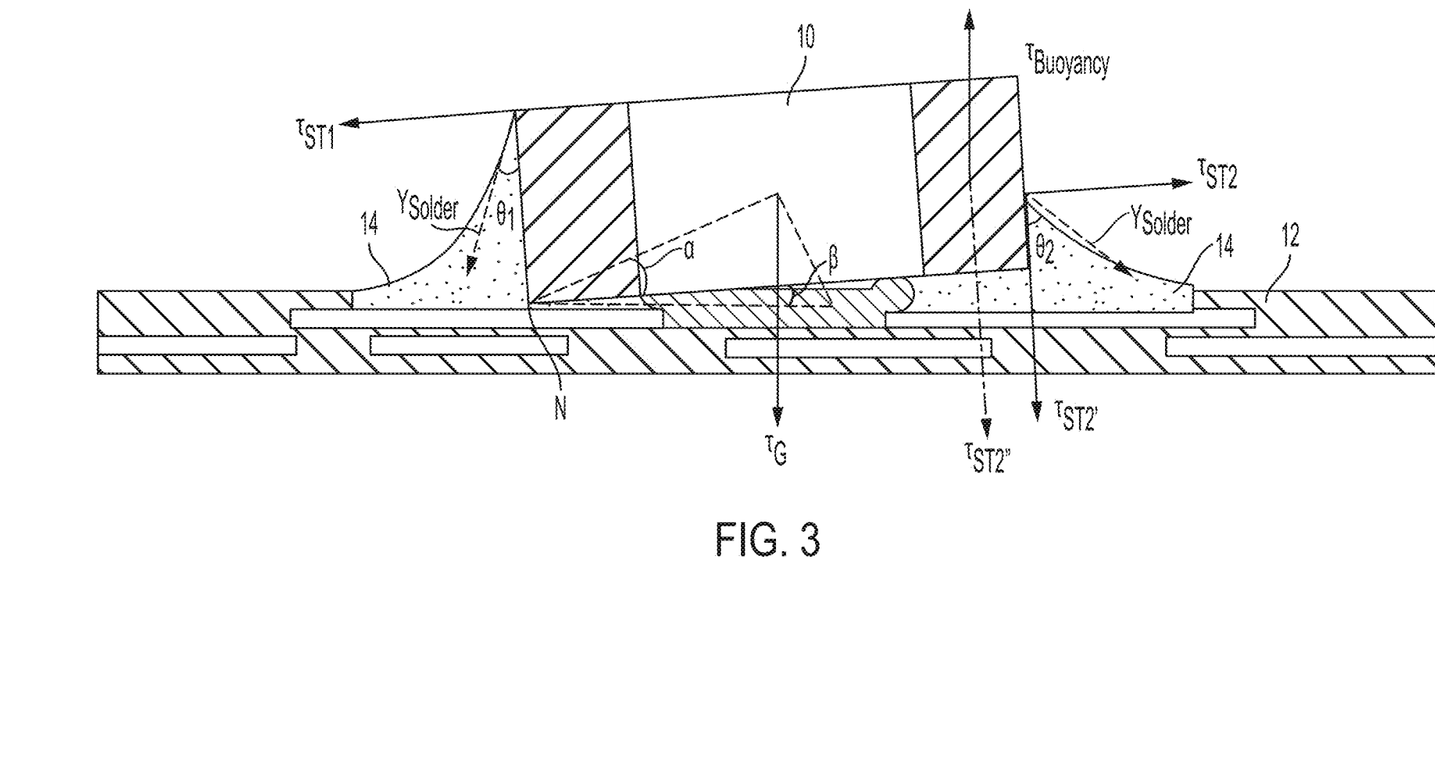
FIG. 3 is magnified side cross-sectional view of a substrate having an electrical component mounted thereto including an illustration of forces affecting the orientation and/or position of the electrical component relative to the substrate.

Referring to FIG. 3, there is shown an illustration of an electrical component 10 offset from an intended orientation relative to a substrate 12 due to reflow soldering. FIG. 3 is provided to facilitate better understanding of the systems and methods of the present disclosure and it will be understood that FIG. 3 illustrates an electrical component 10 undergoing a conventional method of reflow soldering. In FIG. 3, the electrical component 10 is a surface mount capacitor coupled to the substrate 12 via two volumes of solder material 14 disposed at opposite ends of the electrical component 10. As discussed above, in conventional systems and methods of soldering, including reflow soldering, the electrical component 10 may be displaced and/or rotate relative to the substrate 12 due to the heating of the solder material 14. As the solder material 14 is subjected to controlled heat, the solder material 14 undergoes a "wetting" process in which the solder material 14 transitions to a molten fluid state. In the fluid molten state, the solder material 14 may spread along portions of the electrical component and form bonds with the metal of the substrate 12 and electrical component 10. However, during wetting, the solder material 14 may spread unevenly causing the electrical component 10 to shift and/or rotate relative to the substrate 12 resulting in defects such as, but not limited to, component shift and tombstoning. Such instances may be characterized as poor wetting of the solder material 14.

Poor wetting of the solder material may result in an unbalanced distribution of forces on the electrical component 10, as illustrated in FIG. 3. In FIG. 3, the forces are represented as moment forces ($\tau$), also referred to as moment or torque. The moment forces $\tau$ are calculated about a pivot point N located at the bottom left corner of the electrical component 10. In order to decrease the risk of rotation of the electrical component 10 (e.g., reduce the risk of tombstoning) it may be desirable to balance the moment force about the pivot point N $\tau_N$.

The individual moment forces may be calculated as follows:

$$\tau_G = GL*\cos(\alpha+\beta)/(2*\cos\alpha)$$

where $\tau_G$ is the moment force cause by gravity,
L is the length of the electrical component 10 in meters,
G is the gravitational constant,
$\alpha$ is the angle formed between the bottom surface of the electrical component 10 and a line extending from pivot point N to the center of gravity of the electrical component 10, and
$\beta$ is the angle of the bottom surface of the electrical component 10 relative to the horizontal.

$$\tau_{ST1} = (\gamma_{solder} \sin\theta_1)n_1 W_{cap} H_{cap}$$

where $\tau_{ST1}$ is the moment force caused by the solder material 14 at the pivot point N,
$\gamma_{solder}$ is the surface tension of the solder material 14,
$\theta_1$ is the contact angle of the respective solder material 14,
$n_1$ is the fraction of the solder height at the terminal with the pivot point N,
$W_{cap}$ is the width of the electrical component 10 in meters, and
$H_{cap}$ is the thickness of the electrical component 10 in meters.

$$\tau_{ST2} = (\gamma_{solder} \sin\theta_2)n_2 W_{cap} H_{cap}$$

where $\tau_{ST2}$ is the first moment force caused by the solder material 14 on the tipping side of the electrical component 10 (e.g., the solder material 14 on the right in FIG. 3),
$\gamma_{solder}$ is the surface tension of the solder material 14,
$\theta_2$ is the contact angle of the respective solder material 14,
$n_2$ is the fraction of solder height on the tipping side,
$W_{cap}$ is the width of the electrical component 10 in meters, and
$H_{cap}$ is the thickness of the electrical component 10 in meters.

$$\tau_{ST2'} = (\gamma_{solder} \cos\theta_2)n_2 W_{cap} L$$

where $\tau_{ST2'}$ is the second moment force caused by the solder material 14 on the tipping side of the electrical component 10.
$\gamma_{solder}$ is the surface tension of the solder material 14,
$\theta_2$ is the contact angle of the respective solder material 14,
$n_2$ is the fraction of solder height on the tipping side,
$W_{cap}$ is the width of the electrical component 10 in meters, and
L is the length of the electrical component 10 in meters $$T_{ST2''} = (\gamma_{solder} \cos\theta_2)n_2 * 2T_W L$$

where $T_{ST2''}$ is the third moment force caused by the solder material 14 on the tipping side of the electrical component 10,
$\gamma_{solder}$ is the surface tension of the solder material 14,
$\theta_2$ is the contact angle of the respective solder material 14,
$n_2$ is the fraction of solder height on the tipping side,
$T_W$ is the terminal width of the electrical component 10 in meter. In some embodiments, the third moment force $\tau_{ST2''}$ may be disregarded for some resistors (e.g., surface mount resistors), and
L is the length of the electrical component 10 in meters $$\tau_{Buoyancy} = \rho V g * L$$

where $\tau_{Buoyancy}$ is the moment force caused by buoyancy,
$\rho$ is the density of the solder material 14 in kg/m$^3$,
g is gravitational acceleration, and
L is the length of the electrical component 10 in meters The total moment force $\tau_N$ about pivot point N may be calculated as follows:

$$\tau_N = (n_1 \sin\theta_1 - n_2 \sin\theta_2)\gamma_{solder} W_{cap} H_{cap} + \rho V g * L - (n_2 \cos\theta_2)\gamma_{solder}(W_{cap}+2T_W)L - GL/2*(\cos\beta - \sin\beta \tan\alpha)$$

where $n_1$ is the fraction of the solder height at the terminal with the pivot point N,
$\theta_1$ is the contact angle of the respective solder material 14,
$n_2$ is the fraction of solder height on the tipping side,
$\theta_2$ is the contact angle of the respective solder material 14,
$\gamma_{solder}$ is the surface tension of the solder material 14,
$W_{cap}$ is the width of the electrical component 10 in meters,
$H_{cap}$ is the thickness of the electrical component 10 in meters,
$\rho$ is the density of the solder material 14 in kg/m$^3$,
g is gravitational acceleration,
L is the length of the electrical component 10 in meters,
$T_W$ is the terminal width of the electrical component 10 in meters,
G is the gravitational constant,
$\beta$ is the angle of the bottom surface of the electrical component 10 relative to the horizontal, and
$\alpha$ is the angle formed between the bottom surface of the electrical component 10 and a line extending from pivot point N to the center of gravity of the electrical component 10

Decreasing the total moment force TN may reduce the risk that the electrical component tilts or rotates about the pivot point N. The total moment force $\tau_N$ about the pivot point N of the electrical component N may be decreased by increasing or decreasing the various moment forces as calculated above. For example, increasing the moment force $\tau_G$ caused by gravity (e.g., increasing G and/or L, decreasing $\alpha$ and/or H/L) may decrease the total moment force $\tau_N$.

Furthermore decreasing $\tau_{ST1}/\tau_{ST2}$ and/or increasing $\tau_{ST2'}$ may also decrease the total moment force. This may be accomplished by decreasing the contact angles $\theta_1$ and/or $\theta_2$ of the solder material 14, which may be accomplished by decreasing the volume V of the solder material 14 and/or by shortening the length of the solder material 14 along the substrate 12. Furthermore, increasing the terminal width $T_W$, decreasing $n_1/n_2$, and/or increasing the length L and decreasing the height H of the electrical component 10 in order to optimize the torque surface tension. It will be understood that although what is illustrated in FIG. 3 is a conventional system and method for reflow soldering the moment forces, as described above, may apply to the electrical components 104 of the exemplary systems and methods discussed herein.

Figure 4:
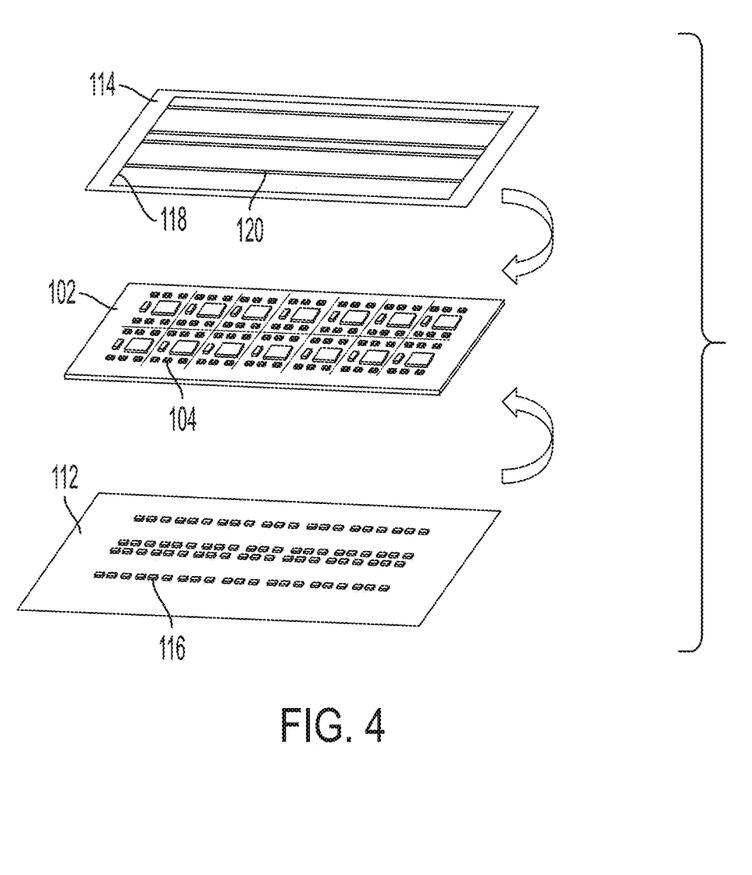
FIG. 4 is an exploded perspective view of the substrate assembly of FIG. 1 with a carrier and carrier cover in accordance with an exemplary embodiment of the present disclosure.

Referring to FIG. 4, in some embodiments, there is a carrier 112 and a carrier cover 114 configured to prevent, or at least reduce the occurrence of component shift and/or tomb stoning of the electrical components 104 during soldering. The carrier 112 may include one or more magnets 116 configured to exert a magnetic force on the electrical components 104 in order to maintain the orientation of the electrical components 104 during soldering. It will be understood that the magnetic force exerted by the one or more magnets 116 may be factored into the calculations for the total moment force $\tau_N$ discussed above. For example, the magnetic force may decrease the total moment force $\tau_N$ thereby preventing, or at least reducing the risk of component shift and/or tombstoning. The carrier cover 114 may define an opening 118 extending through the thickness of the carrier cover 114 and one or more plates 120 extending across the opening 118. The plates 120 may be configured to prevent tombstoning of the electrical components 104 during soldering. For example, the plates 120 may act as a physical barrier or stop that prevents the electrical components 104 from rotating relative to the substrate 102 by a predetermined amount. Put another way, in an instance where the electrical components 104 rotate relative to the substrate 102, the maximum angle of rotation may be restricted by the plates 120.

Figure 5A:
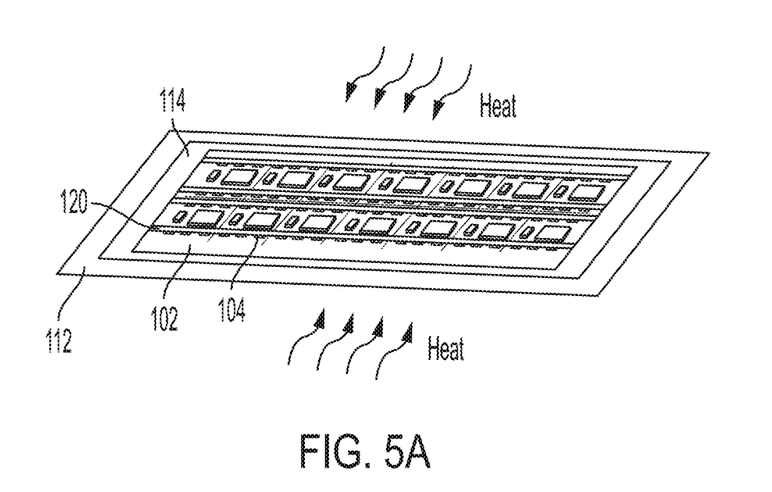
FIG. 5A is a perspective view of the substrate assembly of FIG. 1 positioned between the carrier and carrier cover of FIG. 4.
Figure 5B:
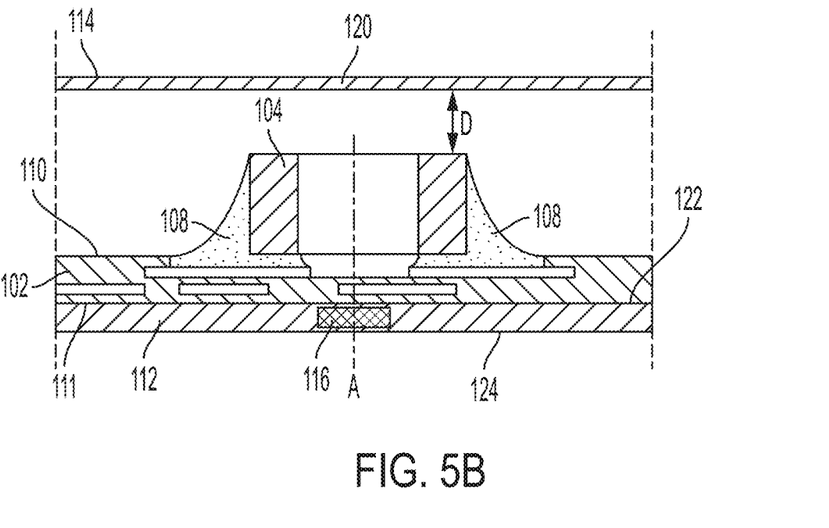
FIG. 5B is a magnified side cross-sectional view of the substrate assembly of FIG. 1 positioned between the carrier and carrier cover of FIG. 4.

Referring to FIGS. 5A-5B, the substrate 102, and the electrical components 104 mounted thereon may be positioned between the carrier 112 and the carrier cover 114 and subjected to controlled heating for soldering. The carrier 112 may include a top carrier surface 122 and a bottom carrier surface 124 opposite the top carrier surface 122. In some embodiments, each of the magnets 116 is disposed between the top and bottom carrier surfaces 122, 124. In some embodiments, each of the magnets 116 is embedded within the carrier 112 between the top and bottom carrier surfaces 122, 124. In some embodiments, the substrate 102 is mounted on the carrier 112 such that the bottom planar surface 111 of the substrate 102 and the top carrier surface 122 abut one another. In some embodiments, the carrier 112 has a thickness as measured in a direction perpendicular to the top and bottom carrier surfaces 122, 124 of about 3 mm. The thickness of the carrier 112 may be greater than the thickness of the magnets 116. In some embodiments, the carrier 112 may be a substrate having a plurality of layers. In some embodiments, the plurality of layers may alternate between conductive and non-conductive layers. The conductive layers may include signal traces. In some embodiments, the magnets 116 embedded in the carrier 112 substrate may receive an electrical current transmitted via one or more of the conductive layers such that the magnets 116 generate a magnetic force.

The plates 120 of the carrier cover 114 may be positioned directly above the electrical components 104. In some embodiments, there is a gap formed between the carrier cover 114 and the electrical components 104. For example, the plates 120 may be offset from the electrical components by a distance D. In this manner, the plates 120 may not abut the electrical components 104 while they are in their original position and/or orientation and may act as a barrier preventing the electrical components from rotating beyond a maximum angle. The distance D may be dependent upon the angle of rotation for an electrical component 104 at which tombstoning would occur. For example, the distance D may be less than a change in height caused by the rotation of the electrical component 104 that result in tombstoning. The change in height caused by the rotation of the electrical component 104 that would result in tombstoning may be referred to herein as the "tombstoning value". In some embodiments, the distance D is dependent upon a maximum contact angle $\theta_1$, $\theta_2$ of the solder material 108. For example, as the contact angle $\theta_1$, $\theta_2$ of a respective solder material 108 increases a moment force exerted by the respective solder material 108 on the electrical component 104 may increase. As such, the distance D may be less than a distance (e.g., the tombstoning value) that would result in a moment force exerted by the respective solder material 108 from overcoming the moment force of gravity and/or the moment force caused by the magnet 116. In some embodiments, the distance D is about 10 micrometers. In some embodiments, the tombstoning value may be dependent upon the size of the electrical component 104. For example, and as provided below in Table 1, some ranges of tombstoning values for electrical components 104 characterized by different SMD package types are provided below. It will be understood that the distance D may be less than the tombstoning values provided below.

TABLE 1

Tombstoning Value Ranges by SMD Package Type

| Electrical Component Size by SMD Package Type Code | Tombstoning Value Range (micrometers) |
|---|---|
| 0201 | 40-50 |
| 0402 | 50-60 |
| 0603 Cap | 60-70 |
| 0805 | 70-80 |

The one or more magnets 116 may be positioned between the top carrier surface 122 and the bottom carrier surface 124. In some embodiments, each of the one or more magnets 116 is positioned within the carrier 112 such that each magnet 116 may exert a magnetic force on a corresponding electrical component 104. For example, each of the one or more magnets 116 may be positioned within the carrier 112 such that each of the magnets 116 are positioned directly below a corresponding electrical component 104. There may be a single magnet 116 positioned directly below each of the electrical components 104 when the substrate 102 is positioned above the carrier 112. In some embodiments, a magnet 116 being directly below a corresponding electrical component 104 refers to the magnet 116 being positioned in a generally central position relative to the electrical component 104. For example, each electrical component 104 has an intended position relative to the substrate 102 that may be represented by a continuous surface area on the surface of the substrate 102. Each magnet 116 corresponding to a respective electrical component 104 may be positioned so that it is centered within and below that surface area. Put another way, a vertical axis A extending through the geometric center and/or center of gravity of the electrical component 104 may extend through the geometric center of the magnet 116 as well.

As discussed above, each of the magnets 116 may be configured to prevent tombstoning and/or component shift of the electrical component 104 that the magnet 116 is positioned directly below. For example, the magnetic force exerted by a magnet 116 may be sufficient to overcome any shift of the electrical component 104 in a direction transverse to the top planar surface 110 of the substrate 102 and/or rotation of the electrical component 104 relative to the substrate 102. In some embodiments, the amount of the magnetic force exerted by a magnet 116 may be greater than or equal to a force required to cause the total moment force $\tau_N$ to be less than or equal to zero. For example, the magnetic force exerted by a magnet 116 in combination with the force of gravity may be large enough to overcome the moment forces exerted on the electrical component 104 by the solder material 108. In some embodiments, the magnetic force exerted by a magnet 116 in combination with the force of gravity must be great enough to overcome any surface tension force from the solder material 108. In some embodiments, the magnetic force exerted by each of the one or more magnets 116 is between about $336*10^{-6}$N to about $865*10^{-6}$N.

In some embodiments, by exerting a magnetic force on the electrical components 104, via corresponding magnets 116 during soldering the wetting of the solder material 108 on opposite ends of the electrical component 104 may occur more evenly when compared to conventional systems and methods. In some embodiments, by exerting a magnetic force in combination with the force of gravity on the electrical component 104 that is great enough to overcome the surface tension forces exerted by the solder material 108, the wettability of the solder material 108 contacting the opposing ends of the electrical component 104 (e.g., the terminal ends) may be optimized. For example, the surface tension of the solder material 108 in combination with the magnetic force exerted by the magnets 116 may reduce the occurrence of component shift during soldering thereby creating a balanced moment force exerted on the terminal ends of the electrical component 104 by the solder material 108. In this manner, the magnets 116 may reduce the risk of tombstoning and/or component shift when compared to conventional systems and methods.

The recommended magnetic force may be calculated based on the following equation:

$$F_{magnet} + F_{gravity} > F_{tension1} \cos \theta_1 + F_{tension2} \cos \theta_2$$

where, $F_{magnet}$ is the magnetic force exerted by the magnet 116, $F_{gravity}$ is the force of gravity, $F_{tension1}$ is the force exerted by the surface tension of the solder material 108 at one terminal end of the electrical component 104, $\theta_1$ is the contact angle of the respective solder material 14, $F_{tension2}$ is the force exerted by the surface tension of the solder material 108 at the opposite terminal end of the electrical component 104, and $\theta_2$ is the contact angle of the respective solder material 14

Some examples of recommended magnetic forces based on the dimensions and mass of the electrical component 104, and the surface tension of the solder material 108 are provided below in Table 2.

TABLE 2

Examples of recommended magnetic force

| Dimensions | | | | | |
|---|---|---|---|---|---|
| Length (μm) | Width (μm) | Thickness (μm) | Weight (mg) | Surface Tension (N/m) | Recommend $F_{magnet}$/N |
| 600 | 300 | 250 | 0.35 | 0.567 | 0.000337 |
| 1000 | 500 | 350 | 1.8 | | 0.000549 |
| 1600 | 800 | 450 | 4.2 | | 0.000865 |

In some embodiments, each magnet 116 has a maximum operating temperature that is greater than the temperature required for soldering. In this manner each of the magnets 116 may be configured to exert a magnetic force on a corresponding electrical component 104 that is sufficient to maintain the orientation of the electrical component 104 during soldering. In some embodiments, each of the magnets 116 has a maximum operating temperature of at least 350 degrees Celsius. In some embodiments, each of the magnets 116 include cobalt. In some embodiments each of the magnets 116 are Chinese Fir Cobalt magnets. In some embodiments, each of the magnets 116 are Samarium Cobalt magnets. In some embodiments, each of the magnets 116 may be generally the same size and/or exert generally the same magnetic force as one another.

Figure 6:
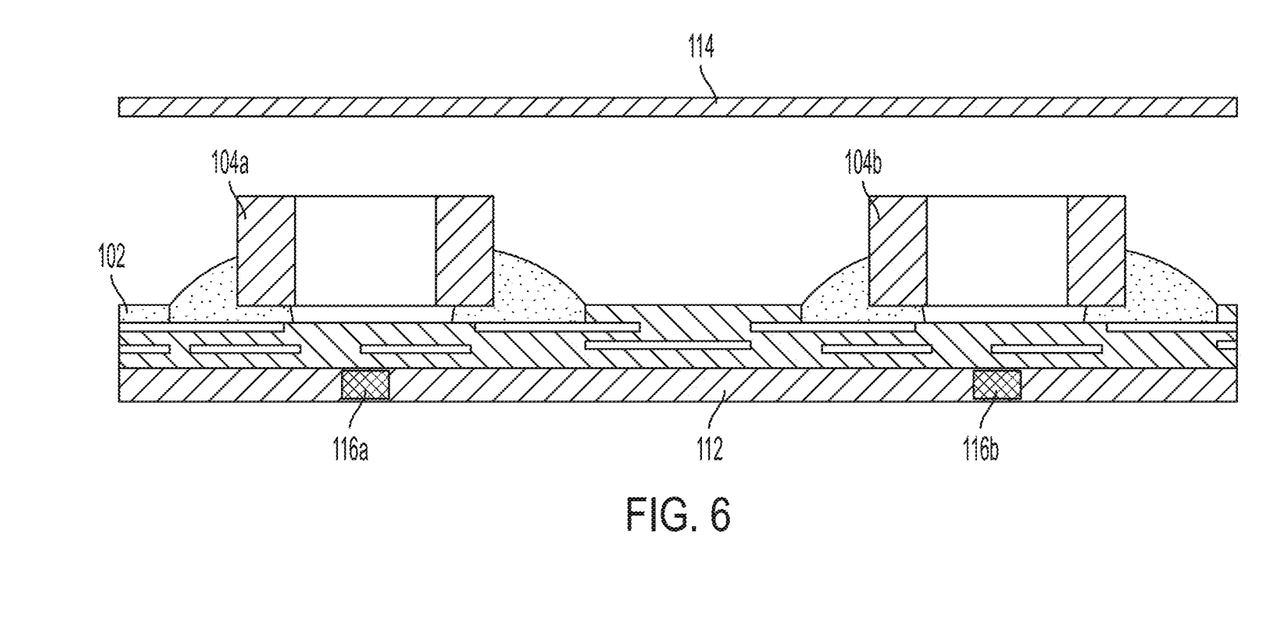
FIG. 6 is a magnified side cross-sectional view of the substrate assembly of FIG. 1 having two electrical components mounted thereon and positioned between the carrier and carrier cover of FIG. 4.

Referring to FIG. 6, in some embodiments, each of the magnets 116 is spaced from each other magnet 116 such that the magnetic force exerted by any one magnet 116 does not affect the position and/or orientation of an adjacent electrical component 104. For example, there may be a first magnet 116a positioned directly below a first electrical component 104a and a second magnet 116b positioned directly below a second electrical component 104b. The magnetic force exerted by the first magnet 116a may affect the position and/or orientation of the first electrical component 104a while not affecting the position and/or orientation of the second electrical component 104b. Similarly, the magnetic force exerted by the second magnet 116a may affect the position and/or orientation of the second electrical component 104b while not affecting the position and/or orientation of the second electrical component 104b.

Figure 7:
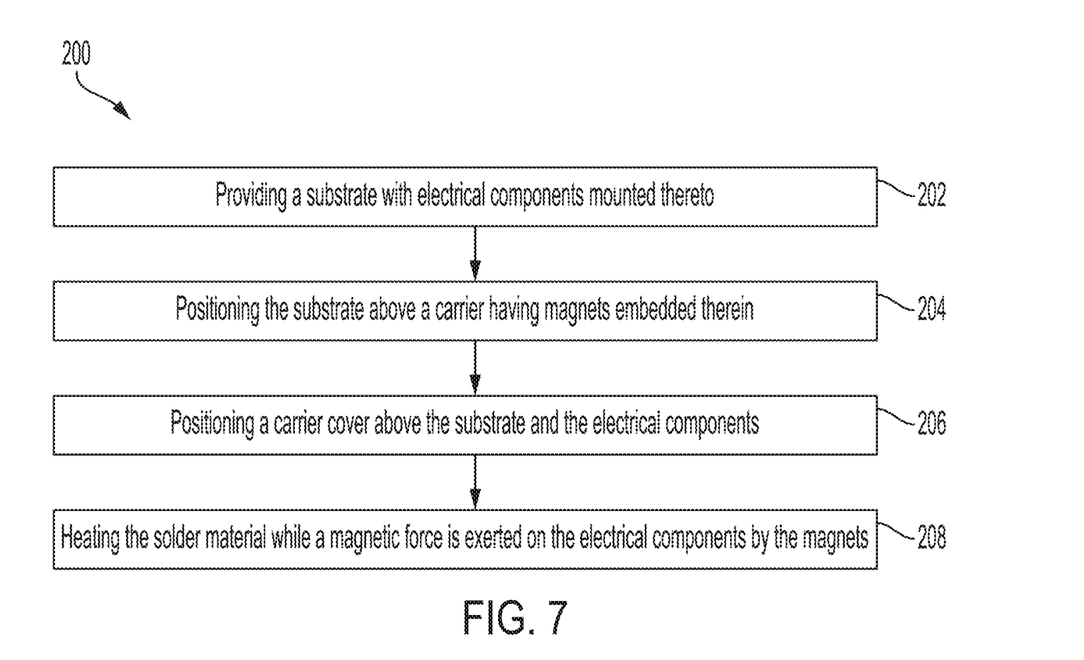
FIG. 7 is a flowchart illustrating a method of soldering electrical components to a substrate in accordance with an exemplary embodiment of the present disclosure.

Referring to FIG. 7, there is a flowchart illustrating a method, generally designated 200, of soldering one or more electrical components to a substrate in accordance with an exemplary embodiment of the present disclosure. The method 200 may include the step 202 of providing a substrate with electrical components mounted thereto. For example, substrate 102 may be provided, having a top planar surface 110 and a bottom planar surface 111. An amount of solder material 108 may be applied to the top planar surface 110 of the substrate 102. One or more electrical components 104 may be mounted on the solder material 108 such that each of the electrical components 104 has a position and orientation relative to the substrate 102. The method 200 may include the step 204 of positioning the substrate above a carrier having magnets embedded therein. For example, carrier 112, having a top carrier surface 122 and a bottom carrier surface 124, may be provided. The one or more magnets 116 may be embedded therein between the top and bottom carrier surfaces 122, 124. The substrate 102 may be positioned above the carrier 112 such that the bottom planar surface 111 of the substrate 102 is above the top carrier surface 122 of the carrier 112. Each of the one or more magnets 116 may be positioned directly below a corresponding electrical component 104 of the one or more electrical components.

The method 200 may include the step 206 of positioning a carrier cover above the substrate and the electrical components. For example, the carrier cover 114 may be positioned above the top planar surface 110 of the substrate 102 such that there is a gap (e.g., the gap having a distance D in FIG. 5B) between the carrier cover 114 and the one or more electrical components 104. The method 200 may include the step 208 of heating the solder material while a magnetic force is exerted on the electrical components by the magnets. For example, the substrate 102, carrier 112, and carrier cover 114 (as shown in FIG. 5A) may be heated along with the solder material 108 to a predetermined temperature for a predetermined amount of time to cause the solder material 108 to melt. During the heating of the solder material 108, each of the magnets 116 may exert a magnetic force on a corresponding electrical component 104 to maintain the orientation of said electrical component 104 relative to the substrate 102 while the solder material melts. In some embodiments, heating the solder material includes positioning the substrate 102 having the one or more electrical components 104 mounted thereto via the solder material 108, the carrier 112 and the carrier cover 114 in a reflow oven and operating the reflow oven to cause the solder material to melt.

In this manner, the carrier 112 and the magnets 116 embedded therein may prevent or at least reduce the occurrence of component shift and/or tomb stoning by exerting a magnetic force on the electrical components 104 while the solder material 108 melts. Furthermore, the carrier cover 114 may also ensure that tomb stoning does not occur by providing a physical barrier preventing rotation of the electrical components 104 beyond a predetermined amount, as discussed above with reference to FIGS. 5A-5B. In some embodiments, the carrier cover 114 may not be positioned above the substrate 102 and the electrical components 104 mounted thereto during soldering. For example, the method 200 may not include step 206 of positioning the carrier cover above the substrate 102.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one". As used herein, the term "about" may refer to +/−10% of the value referenced. For example, "about 9" is understood to encompass 8.1 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A method of soldering one or more components to a substrate, the method comprising:
providing a substrate having a top planar surface and a bottom planar surface;
applying an amount of solder material to at least a portion of the top planar surface of the substrate;
mounting one or more electrical components on the solder material, each of the one or more electrical components having a position and orientation relative to the substrate;
providing a carrier having a top carrier surface and a bottom carrier surface, and one or more magnets disposed between the top and bottom carrier surfaces;
positioning the substrate above the carrier such that the bottom planar surface of the substrate is above the top carrier surface and each of the one or more magnets is positioned directly below a corresponding electrical component of the one or more electrical components;
positioning a carrier cover above the top planar surface of the substrate such that there is a gap between the carrier cover and the one or more electrical components; and
heating the solder material to a predetermined temperature for a predetermined amount of time to cause the solder material to melt; and
during heating of the solder material, exerting, by each of the one or more magnets, a magnetic force on a corresponding electrical component of the one or more electrical components to maintain the orientation of the corresponding electrical component relative to the substrate while the solder material melts.

2. The method of claim 1, wherein the magnets are configured to prevent tombstoning of the one or more electrical components during the heating step.

3. The method of claim 1, wherein the one or more magnets includes a first magnet and a second magnet positioned adjacent to the first magnet, wherein the one or more electrical components includes a first electrical component corresponding to the first magnet and a second electrical component corresponding to the second magnet, and
wherein the magnetic force exerted by the first magnet does not affect the position or orientation of the second electrical component corresponding to the second magnet.

4. The method of claim 1, wherein the gap between the carrier cover and the one or more electrical components is about 10 micrometers.

5. The method of claim 1, wherein each of the one or more magnets disposed within the carrier have a maximum operating temperature that is greater than the predetermined temperature that the solder material is heated to during the heating step.

6. The method of claim 1, wherein each of the one or more magnets disposed within the carrier have a maximum operating temperature of at least 350 degrees Celsius.

7. The method of claim 1, wherein each of the one or more magnets disposed within the carrier have a magnetic force between about $336*10^{-6}$ N to about $865*10^{-6}$ N.

8. The method of claim 1, wherein the heating step includes positioning the substrate having the one or more electrical components mounted thereto via the solder material, the carrier and the carrier cover in a reflow oven and operating the reflow oven to cause the solder material to melt.

9. A method for soldering one or more electrical components to a substrate comprising an amount of solder material coupling the one or more electrical components to the substrate, the method comprising:

positioning a carrier below the substrate, the carrier including one or more magnets embedded therein, each of the one or more magnets positioned directly below a corresponding electrical component of the one or more electrical components;

positioning a carrier cover above the substrate and spaced from the substrate such that there is a gap between the carrier cover and the one or more electrical components; and heating the solder material to a predetermined temperature for a predetermined amount of time to cause the solder material to melt, wherein during heating of the solder material each of the one or more magnets exerts a magnetic force on a corresponding electrical component of the one or more electrical components to maintain the orientation of the corresponding electrical component relative to the substrate while the solder material flows about the corresponding electrical component.

10. The method of claim 9, wherein the magnets are configured to prevent tombstoning of the one or more electrical components during the heating step.

11. The method of claim 9, wherein the magnets are configured to prevent the one or more electrical components from shifting in a direction that is transverse to the top planar surface of the substrate during the heating step.

12. The method of claim 9, wherein the gap between the carrier cover and the one or more electrical components is about 10 micrometers.

13. The method of claim 9, wherein each of the one or more magnets embedded within the carrier have a maximum operating temperature that is greater than the predetermined temperature that the solder material is heated to during the heating step.

14. The method of claim 9, wherein each of the one or more magnets embedded within the carrier have a maximum operating temperature of at least 350 degrees Celsius.

15. The method of claim 9, wherein each of the one or more magnets embedded within the carrier have a magnetic force between about $336*10^{-6}$ N to about $865*10^{-6}$ N.

16. The method of claim 9, wherein the heating step includes positioning the substrate having the one or more electrical components mounted thereto via the solder material, the carrier and the carrier cover in a reflow oven and operating the reflow oven to cause the solder material to melt.

* * * * *